United States Patent
Litton et al.

(10) Patent No.: US 10,280,517 B2
(45) Date of Patent: May 7, 2019

(54) MULTI-MATERIAL THERMAL BARRIER COATING SYSTEM

(71) Applicant: United Technologies Corporation, Farmington, CT (US)

(72) Inventors: David A. Litton, West Hartford, CT (US); Brian S. Tryon, Los Gatos, CA (US)

(73) Assignee: United Technologies Corporation, Farmington, CT (US)

( * ) Notice: Subject to any disclaimer, the term of this patent is extended or adjusted under 35 U.S.C. 154(b) by 15 days.

(21) Appl. No.: 15/249,955

(22) Filed: Aug. 29, 2016

(65) Prior Publication Data

US 2016/0362796 A1    Dec. 15, 2016

Related U.S. Application Data

(62) Division of application No. 13/431,056, filed on Mar. 27, 2012, now Pat. No. 9,428,837.

(51) Int. Cl.
*C23C 28/00* (2006.01)
*C23C 14/02* (2006.01)
(Continued)

(52) U.S. Cl.
CPC .......... *C23C 28/347* (2013.01); *C23C 14/025* (2013.01); *C23C 14/08* (2013.01);
(Continued)

(58) Field of Classification Search
CPC .................................................. C23C 14/243
See application file for complete search history.

(56) References Cited

U.S. PATENT DOCUMENTS 5,378,500 A * 1/1995 Ward-Close ............ C22C 47/04
204/192.1
5,614,273 A * 3/1997 Goedicke ................ C23C 14/24
118/50.1
(Continued)

FOREIGN PATENT DOCUMENTS

EP    1772441 A1    4/2007
EP    2269966 A2    1/2011
(Continued)

OTHER PUBLICATIONS

International Search Report and Written Opinion for PCT/US2013/028962, dated Jun. 2, 2013.
(Continued)

*Primary Examiner* — Joseph A Miller, Jr.
(74) *Attorney, Agent, or Firm* — Bachman & LaPointe, P.C.

(57) ABSTRACT

The thermal barrier coating system comprises a matrix of a first chemistry with multiple embedded second phases of a second chemistry. The matrix comprises a stabilized zirconia. The second regions comprise at least 40 mole percent of oxides having the formula $Ln_2O_3$, where Ln is selected from the lanthanides La through Lu, Y, Sc, In, Ca, and Mg with the balance zirconia ($ZrO_2$), hafnia ($HfO_2$), titania ($TiO_2$), or mixtures thereof. The second phases have a characteristic thickness ($T_6$) of less than 2.0 micrometers (μm). The spacing between second phases has a characteristic thickness ($T_5$) of less than 8.0 micrometers (μm).

26 Claims, 2 Drawing Sheets

(51) Int. Cl.

| | | |
|---|---|---|
| *C23C 14/08* | (2006.01) | |
| *C23C 14/30* | (2006.01) | |
| *F01D 5/28* | (2006.01) | |
| *C23C 28/04* | (2006.01) | |
| *C23C 14/24* | (2006.01) | |
| *C23C 14/54* | (2006.01) | |
| *F01D 25/00* | (2006.01) | |

(52) U.S. Cl.
CPC .......... *C23C 14/083* (2013.01); *C23C 14/243* (2013.01); *C23C 14/30* (2013.01); *C23C 14/542* (2013.01); *C23C 28/042* (2013.01); *C23C 28/321* (2013.01); *C23C 28/3215* (2013.01); *C23C 28/345* (2013.01); *C23C 28/3455* (2013.01); *F01D 5/288* (2013.01); *F01D 25/005* (2013.01); *F05D 2220/32* (2013.01); *Y10T 428/24975* (2015.01)

(56) References Cited

U.S. PATENT DOCUMENTS

| | | | |
|---|---|---|---|
| 5,792,521 A | 8/1998 | Wortman | |
| 5,856,027 A * | 1/1999 | Murphy | C23C 14/083 148/537 |
| 5,876,860 A | 3/1999 | Marijnissen et al. | |
| 6,025,078 A | 2/2000 | Rickerby et al. | |
| 6,054,184 A | 4/2000 | Bruce et al. | |
| 6,057,047 A * | 5/2000 | Maloney | C23C 28/042 416/241 B |
| 6,261,643 B1 | 7/2001 | Hasz et al. | |
| 6,548,190 B2 | 4/2003 | Spitsberg et al. | |
| 6,620,525 B1 | 9/2003 | Rigney et al. | |
| 6,764,779 B1 | 7/2004 | Liu et al. | |
| 6,770,333 B2 | 8/2004 | Bruce et al. | |
| 6,875,529 B1 | 4/2005 | Spitsberg et al. | |
| 6,974,641 B1 | 12/2005 | Choy et al. | |
| 7,074,506 B2 | 7/2006 | Chaput et al. | |
| 7,326,470 B2 | 2/2008 | Ulion et al. | |
| 7,491,431 B2 | 2/2009 | Chiruvolu et al. | |
| 7,785,722 B2 | 8/2010 | Freling et al. | |
| 7,799,420 B2 | 9/2010 | Beck et al. | |
| 7,838,083 B1 | 11/2010 | Youchison et al. | |
| 2002/0104752 A1* | 8/2002 | McLeod | C23C 14/3464 204/192.12 |
| 2004/0038085 A1 | 2/2004 | Litton et al. | |
| 2004/0038086 A1 | 2/2004 | Litton et al. | |
| 2004/0072497 A1* | 4/2004 | Hirano | C23C 14/081 445/66 |
| 2004/0191544 A1 | 9/2004 | Bast et al. | |
| 2005/0011748 A1* | 1/2005 | Beck | C23C 14/06 204/192.12 |
| 2005/0244663 A1 | 11/2005 | Ulion et al. | |
| 2006/0166018 A1 | 7/2006 | Spitsberg et al. | |
| 2007/0048534 A1 | 3/2007 | Pietraszkiewicz et al. | |
| 2007/0160859 A1 | 7/2007 | Darolia et al. | |
| 2007/0172703 A1 | 7/2007 | Freling et al. | |
| 2008/0057326 A1 | 3/2008 | Schlichting et al. | |
| 2008/0113218 A1 | 5/2008 | Schlichting et al. | |
| 2009/0202864 A1 | 8/2009 | Feist et al. | |
| 2009/0214800 A1* | 8/2009 | Saito | B01J 19/088 427/577 |
| 2009/0324989 A1 | 12/2009 | Witz et al. | |
| 2010/0015401 A1 | 1/2010 | Bolz et al. | |
| 2014/0186656 A1 | 7/2014 | Tryon et al. | |

FOREIGN PATENT DOCUMENTS

| | | |
|---|---|---|
| WO | 01/63008 A2 | 8/2001 |
| WO | 2009/125204 A1 | 10/2009 |
| WO | WO2012027442 * | 3/2012 |

OTHER PUBLICATIONS

Search Report and Written Opinion for Singapore Patent Application No. 11201404599X, dated Sep. 1, 2015.
European Search Report for EP Patent Application No. 13769674.6, dated Dec. 23, 2015.
U.S. Office action for U.S. Appl. No. 13/431,056, dated Jul. 14, 2015.
U.S. Office action for U.S. Appl. No. 13/431,056, dated Jan. 12, 2016.
Search Report and Written Opinion for Singapore Patent Application No. 11201404599X, dated Sep. 13, 2016.
European Office action dated Aug. 9, 2018 for European Patent Application No. 13769674.6.

\* cited by examiner

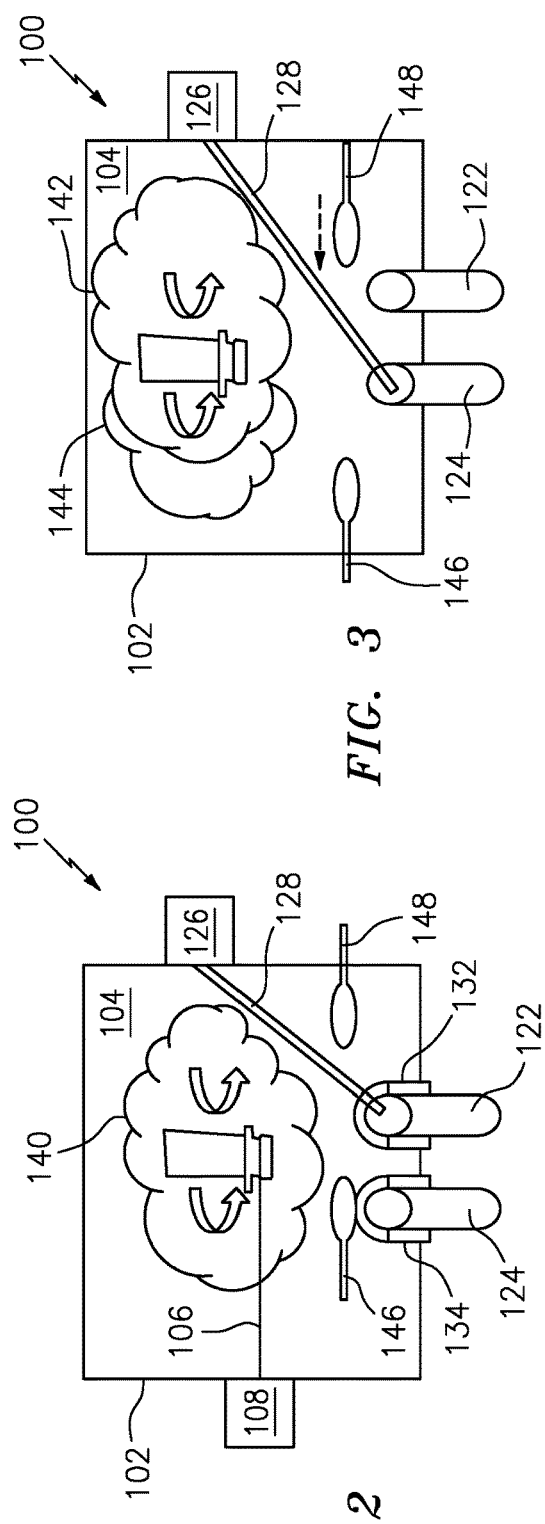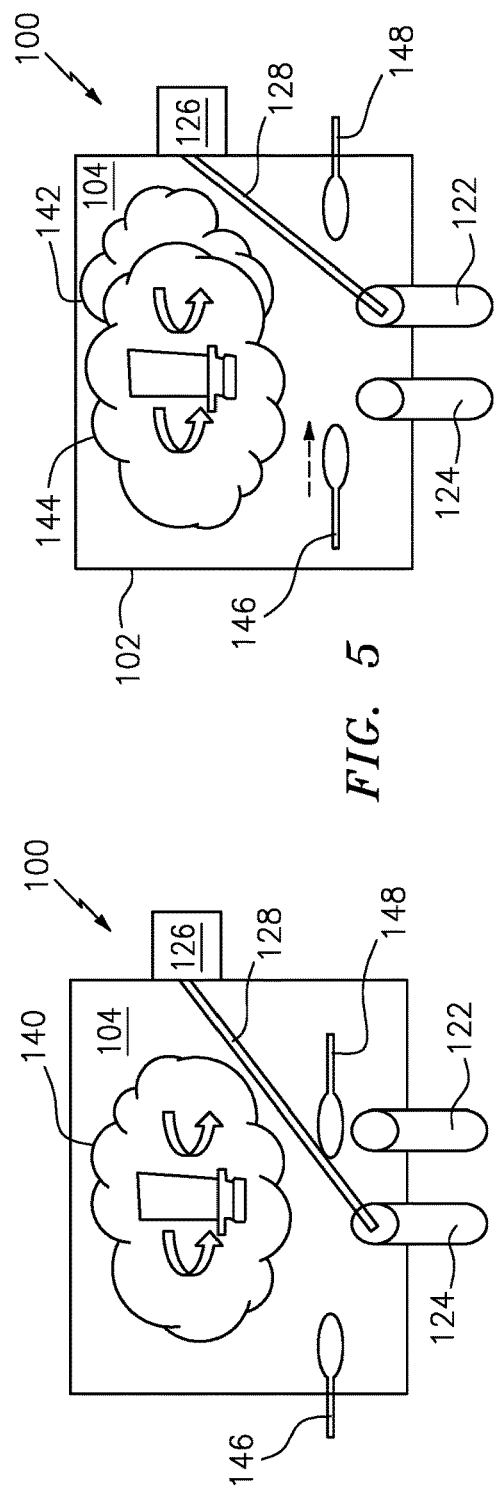

MULTI-MATERIAL THERMAL BARRIER COATING SYSTEM

CROSS-REFERENCE TO RELATED APPLICATION

This is a divisional application of U.S. patent application Ser. No. 13/431,056, filed Mar. 27, 2012, and entitled "Multi-Material Thermal Barrier Coating System", the disclosure of which is incorporated by reference herein in its entirety as if set forth at length.

BACKGROUND

The disclosure relates to thermal barrier coating systems. More particularly, the disclosure relates to thermal barrier coating systems for gas turbine.

U.S. Pat. No. 7,785,722 (the '722 patent) discloses a thermal barrier coating system comprising a YSZ base layer. Thereatop there may be several alternating layers of a molten silicate resistant material and YSZ. The molten silicate resistant material may comprise an oxide of a lanthanide.

SUMMARY

One aspect of the disclosure involves an article comprising a thermal barrier coating system atop a three-dimensional substrate. The thermal barrier coating system comprises a matrix of a first chemistry with multiple embedded second phases of a second chemistry. The matrix comprises a stabilized zirconia. The second regions comprise at least 40 mole percent of oxides having the formula $Ln_2O_3$, where Ln is selected from the lanthanides La through Lu, Y, Sc, In, Ca, and Mg with the balance zirconia ($ZrO_2$), hafnia ($HfO_2$), titania ($TiO_2$), or mixtures thereof. The second phases have a characteristic thickness ($T_6$) of less than 2.0 micrometers (μm). The spacing between second phases has a characteristic thickness ($T_5$) of less than 8.0 micrometers (μm).

In additional or alternative embodiments of any of the foregoing embodiments: the matrix comprises a yttria stabilized zirconia; and the second phases comprise at least 40 mole percent of oxides having the formula $Ln_2O_3$, where Ln is selected from the lanthanides La through Lu, Y, Sc, In, Ca, and Mg with the balance zirconia ($ZrO_2$), hafnia ($HfO_2$), titania ($TiO_2$), or mixtures thereof.

In additional or alternative embodiments of any of the foregoing embodiments: the second phases have characteristic thickness ($T_6$) of 0.15-1.0 μm; and a ratio of the second phases characteristic thickness ($T_6$) to the spacing ($T_5$) between second phases, thickness-wise, is between 1:3 and 1:4.

In additional or alternative embodiments of any of the foregoing embodiments: the matrix with embedded second phases form a layer having a thickness ($T_4$) of at least 76 micrometers.

In additional or alternative embodiments of any of the foregoing embodiments: the matrix with embedded second phases form a layer having a thickness ($T_4$) of 76-350 micrometers.

In additional or alternative embodiments of any of the foregoing embodiments, the article further comprises: a bondcoat; and a first TBC layer between the bondcoat and the matrix.

In additional or alternative embodiments of any of the foregoing embodiments: the first layer has a nominal composition differing from a composition of the matrix by the presence of one or more additives in a total amount of up to 1.0 weight percent.

In additional or alternative embodiments of any of the foregoing embodiments: the characteristic thickness ($T_6$) of the second phases is 0.15-1.0 micrometers (μm), and the characteristic thickness ($T_5$) of the spacing between second phases is 0.5-3.0 micrometers (μm).

In additional or alternative embodiments of any of the foregoing embodiments, the article further comprises: an additional coating layer with a homogeneous chemistry atop the matrix with embedded second phases.

In additional or alternative embodiments of any of the foregoing embodiments: the additional coating layer is more resistant to attack by molten silicate deposits than is the matrix.

In additional or alternative embodiments of any of the foregoing embodiments, the article further comprises: an additional coating layer atop the matrix and comprising oxyapatite and/or garnet.

In additional or alternative embodiments of any of the foregoing embodiments: the matrix and second phases are in a layer of the thermal barrier coating system with thickness ($T_4$) wherein the second phases account for 5-20% of said layer by volume.

Another aspect of the disclosure involves an article comprising: a substrate; and a thermal barrier coating system atop the substrate and having a matrix having a first chemistry and a plurality of embedded second phases layered within the matrix having a second chemistry, different from the first chemistry, wherein the embedded second phases within the matrix have a characteristic perimeter extent of 30-85%.

In additional or alternative embodiments of any of the foregoing embodiments: the matrix comprises a yttria stabilized zirconia; and the second phases comprise at least 40 mole percent of oxides having the formula $Ln_2O_3$, where Ln is selected from the lanthanides La through Lu, Y, Sc, In, Ca, and Mg with the balance zirconia (ZrO2), hafnia ($HfO_2$), titania ($TiO_2$), or mixtures thereof.

In additional or alternative embodiments of any of the foregoing embodiments: at a given location, a depthwise number of the embedded second regions is 7-84.

Another aspect of the disclosure involves a process for coating a substrate, the process comprising: generating a plume of deposition material from a first source and a second source; alternating the composition of the plume by generating vapor from the first and second sources in an alternating manner; and moving the substrate relative to the first and second sources, wherein the moving of the substrate moves a given region of the substrate through the plume at a cyclic rate having a period greater than a duration of generation of the vapor plume from the second source.

In additional or alternative embodiments of any of the foregoing embodiments: the moving consists of a rotation.

In additional or alternative embodiments of any of the foregoing embodiments: a duration of generation of the vapor plume from the first source is 400-5000% of said period; and the duration of generation of the vapor plume from the second source is 30-99% of said period.

In additional or alternative embodiments of any of the foregoing embodiments: the first source comprises a yttria stabilized zirconia; and the second source comprises at least 40 mole percent of oxides having the formula $Ln_2O_3$, where Ln is selected from the lanthanide La through Lu, Y, Sc, In, Ca, and Mg.

In additional or alternative embodiments of any of the foregoing embodiments: the first source comprises a yttria stabilized zirconia; and the second source comprises at least 40 mole percent of oxides having the formula $Ln_2O_3$, where Ln is selected from the lanthanide La through Lu, Y, Sc, In, Ca, and Mg with the balance zirconia ($ZrO_2$), hafnia ($HfO_2$), titania ($TiO_2$), or mixtures thereof.

In additional or alternative embodiments of any of the foregoing embodiments: the relative speed of the moving and the frequency of alternation of the composition of the vapor plume are effective to deposit a matrix with embedded second phase patches of the coating from the first source and second source, respectively.

In additional or alternative embodiments of any of the foregoing embodiments: each of the second phase patches represents less than 85% of the surface area of the substrate.

The details of one or more embodiments are set forth in the accompanying drawings and the description below. Other features, objects, and advantages will be apparent from the description and drawings, and from the claims.

BRIEF DESCRIPTION OF THE DRAWINGS

FIG. 2 is a partially schematic view of a first coating system in a first deposition condition.

FIG. 3 is a view of the first coating system in a second deposition condition.

FIG. 4 is a view of the first coating system in a third deposition condition.

FIG. 5 is a view of the first coating system in a fourth deposition condition.

Like reference numbers and designations in the various drawings indicate like elements.

DETAILED DESCRIPTION

Figure 1:
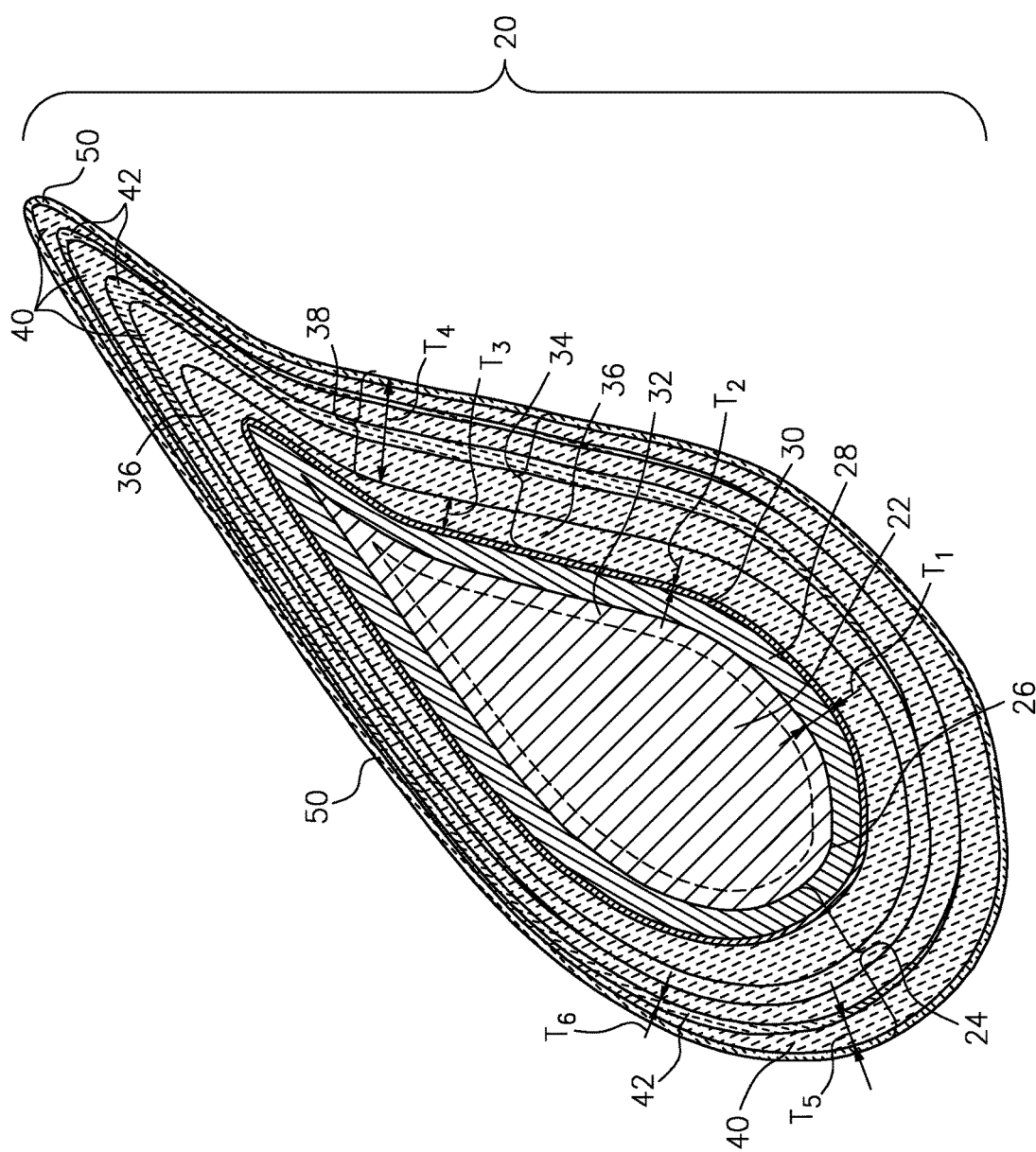
FIG. 1 is a schematic cross-sectional schematic view of a coated substrate with various layers of exaggerated thickness to various degrees.

FIG. 1 schematically shows a coated part 20 comprising a metallic substrate 22 and a thermal barrier coating system 24 atop the surface 26 of the substrate. After any surface preparation of the substrate, an initial deposited layer 28 of the coating system is a bondcoat. Exemplary bondcoat is an MCrAlY, where M refers to a metal, typically Ni and/or Co. An alternate bondcoat is a diffusion aluminide. Exemplary bondcoat deposition is via low pressure plasma spray (LPPS), high velocity oxy-fuel (HVOF), air plasma spray (APS), cathodic arc deposition, plating, and the like. The bondcoat has a thickness $T_1$. The exemplary as-deposited bondcoat thickness may be reduced via growth of a thermally grown oxide 30 which may grow during subsequent stages of deposition and is shown having a thickness $T_2$. Exemplary $T_1$ as applied is 0.3-9 mil (7.6-229 µm), more narrowly 0.5-7 mil (13-178 µm). The bondcoat may also diffuse with the substrate creating a diffusion region or zone 32.

A multi-layer ceramic thermal barrier coating (TBC) 34 may be applied after bondcoat application. The exemplary TBC 34 comprises a base layer 36 applied to a thickness $T_3$. The exemplary base layer is 7YSZ. More broadly, it may be a YSZ such as a 3-9% yttria with balance zirconia. Exemplary $T_3$ is 0.1-5 mil (2.5-127 µm), more narrowly, 0.5-3.5 mil (12.7-89 µm).

Atop the base layer 36, the TBC 34 includes a layer 38 having a thickness $T_4$ and comprising a matrix 40 and embedded second phases 42. FIG. 1 is not drawn to scale. Specifically, the illustrated coating thickness is extremely exaggerated relative to the substrate size for the sake of clarity. The illustrated coating thickness variation around the part is not realistic. Also, the illustrated thicknesses of the embedded second phases are also exaggerated for clarity. Also, the number of illustrated embedded second layers is lower than likely.

The matrix 40 has a first chemistry and the embedded second phases 42 have a second chemistry, different from the first chemistry. The bondcoat layer 28 and the base layer 36 are essentially continuous and of essentially constant thickness over the relevant area of the substrate (e.g., allowing for variations in substrate geometry and for intended differences in thicknesses (e.g., tapering toward near zero at a trailing edge of an airfoil so as to limit aerodynamic losses). Alternatively, with a combustor panel, a relatively uniform thickness along a hot side of the combustor panel but less or no thickness along a cold side of a combustor panel.

The embedded second phases 42 may form incomplete layers that do not extend all the way around the three-dimensional substrate, such that they are embedded within the matrix 40. This is shown in FIG. 1.

Exemplary characteristic thickness $T_6$ of the embedded second phases 42 are measured via an appropriate average (mean, medial, mode, optionally weighted by the amount of material at such thickness). Alternatively, $T_6$ may be a maximum measurement averaged among the regions of a given type. In general, similar thickness numbers may be used as these different definitions may be expected to account for variations of about a factor of two or less. Exemplary $T_6$ is 0.1-2.0 µm, more narrowly, 0.15-1.0 µm or 0.2-0.8 µm.

Exemplary characteristic thicknesses $T_5$ of the matrix 40 between second phases 42 are measured via an appropriate average (mean, medial, mode, optionally weighted by the amount of material at such thickness). Alternatively, $T_5$ may be a maximum measurement averaged among the regions of a given type. In general, similar thickness numbers may be used as these different definitions may be expected to account for variations of about a factor of two or less. Exemplary $T_5$ is 0.3-8.0 µm, more narrowly, 0.5-5.0 µm or 1.0-3.0 µm.

Exemplary $T_4$ is 5-700 µm, more narrowly, 20-600 µm or 50-500 µm.

Exemplary $T_3$ is 3-125 µm, more narrowly, 5-100 µm or 12-75 µm.

As discussed below, the extent to which each individual exemplary embedded phase 42 would extend around the part in the plane of the page would depend on the proportion of a single rotation period during which deposition of the coating chemistry corresponding to that instance of embedded phase 42 was allowed. Exemplary proportions of the substrate surface area that each of the embedded phases 42 would cover would range from 30% to 99%, more narrowly, 30-85% or 50% to 85%. Thus, with variations depending on substrate geometry, viewed about an axis of rotation during coating, the embedded faces 42 would cover such percentages of the perimeter of the part (e.g., exact correspondence if cylindrical). In an alternative definition, such percent extents are measured between boundaries of the phases 42 where each such phase diminishes to 5 percent of its mean thickness.

At a given location along the coated substrate, the depthwise number of second phases 42 may be at least two, more narrowly, at least four or at least ten. Relative to the thickness $T_4$, the number of second phases 42 at a given depthwise location may increase with $T_4$. With lowest $T_4$ of up to 3.0 mil (76 µm), an exemplary number is 1-12, more narrowly, 2-12 or 2-7. At an exemplary $T_4$ of 21.0 mil (533 µm), the exemplary range would be 7-84, more narrowly, 14-49. Thus, the upper limits of these ranges at 3.0 and 21.0 mil may define an upper boundary of a linear function depending upon $T_4$ and the lower boundaries may form a lower linear limit.

There may be further variations. For example, there may be additional layers such as a topcoat 50 (discussed below). Overall, and even with such exemplary additional layers, the thickness $T_4$ of the layer 38 may represent at least an exemplary 30% of a total coating thickness, more narrowly, 50-90%.

In an exemplary implementation, the matrix 40 may have a conventional TBC composition such as a YSZ (e.g., 3-9 weight percent YSZ, or, in particular, 7YSZ) which may be the same as the composition of the base layer 36. Among possible candidate situations for differences between the base layer 36 and the matrix 40 is the use of a luminescent dopant in the base layer. An exemplary dopant is a lanthanide. A laser may be used to excite luminescence from the dopped layer. The luminescence is captured by fiber optics and analyzed. Resulting information can be used for health monitoring of the TBC. Among candidate lanthanides are Eu and Er (because their luminescence wavelengths are in ranges that TBCs do not absorb and the luminescent lifetimes are long enough at high temperatures to get a good signal to noise ratio). Other possible additives are Ti and/or Ta in small amounts to increase the toughness of the base layer. Although small variations between the composition of the layers 40 and the base layer 36 may be desirable from performance aspects, ease of manufacturing and using a common deposition material source may suggest using the same composition or a composition differing only in contamination from materials of the embedded second phases.

The embedded second phases 42 may consist of a material having a significantly lower mechanical strength and fracture toughness than the material of the matrix 40. Any in-plane stresses that exceed the strength of the weak phases 42 (typically 50 to 200 ksi (345-1379 MPa) or 75-150 ksi (517-1034 MPa)) or in-plane strain energy that exceeds the fracture toughness of phases 42 (typically 1-5 J/m$^2$) would be expected to form cracks within phases 42 that would relieve stresses and dissipate strain energy. The associated interembedding of phases 42 within the matrix 40 ensures that any cracks forming in phases 42 would be contained within those phases—thereby avoiding linking of cracks that might lead to large spalls. The fact that the thickness $T_6$ of phases 42 is intentionally kept small would ensure that crack would not widen as they grow, ensuring both crack bridging and friction in the crack wake (both of which would promote dissipation of any strain energy built up in the coating).

Exemplary second phase 42 material may comprise an oxide of a lanthanide or similar material (e.g., material selected from the group consisting of the lanthanides La through Lu (La, Ce, Pr, Nd, Pm, Sm, Eu, Gd, Tb, Dy, Ho, Er, Tm, Yb, and Lu), Y, Sc, In, Ca, and Mg). More specifically, the second phase material may comprise a combination of such oxide and zirconia ($ZrO_2$), hafnia ($HfO_2$), titania ($TiO_2$), or mixtures thereof. For example, the second phase material may comprise 40-100 mole percent (more narrowly, at least 70 mole percent or 70-99 mole percent) of such oxide. The oxide may be a mixture of such oxides or a single such oxide. One particular example involves gadolinia as said oxide in a concentration of at least 90%, more particularly, essentially 100% (e.g., with only impurity levels of other components that do not affect performance).

In the exemplary implementation, the second phases may account for 5-15%, more narrowly, 10-13% of the volume of the layer 38 with the matrix 40 accounting for the remainder (ignoring porosity and transitions). In the exemplary combination system, the presence of the base layer 36 provides maximum mechanical strength in the area of the coating where stresses in the coating are maximum.

Coating deposition may be via an otherwise conventional process and apparatus (e.g., EB-PVD or IE-EB-PVD) for depositing coatings such as YSZ and GSZ. An exemplary such system 100 (FIG. 2) comprises a deposition chamber 102 having an interior 104. In this example, the bondcoat has already been deposited (e.g., using another system/chamber). A substrate/part holder 106 may hold the substrate(s) and may be driven by an actuator 108 for rotating the part (e.g., with a period of 2-20 seconds) and/or engaging in more complex manipulations as is discussed below.

A deposition material source comprises two distinct sources (subsources of the matrix 40 and second phases 42). A first source for the matrix 40 comprises an ingot 122 (e.g., of 7YSZ or of slightly altered chemistry so as to yield a 7YSZ layer when subject to attrition of individual components in the vapor cloud/plume). A second source associated with the second phases 42 comprises a second ingot 124. One or more electron guns 126 may be positioned to direct electron beams 128 to exposed surfaces of the ingots to maintain melt pools for generating the vapor cloud 140. The ingots may be contained in respective crucibles 132 and 134.

FIG. 2 schematically shows a stage or mode wherein the electron beam is directed to essentially exclusively vaporize material from the first ingot 122. This may be used for the deposition of the base layer 36. In this mode and associated stage(s), the vapor cloud 140 consists essentially of material from the first ingot 122. Material from the second ingot 124 may be physically blocked from reaching the substrate by positioning an optional shutter 146 (actuator not shown) between the crucible and the substrate. An exemplary elapsed time during the stage/condition/mode depicted in FIG. 2 would be between 500% and 2000% (5X-20X) of the time period to complete one rotation of the three-dimensional substrate (more broadly, 400-5000%). This allows for the formation of the base layer 36 around the entirety of the coated portion of the part. Where different material or other properties are present in the base layer 36 versus the matrix 40, this step/stage or a similar step/stage may be used to initially deposit an initial portion of the matrix 40.

Next, there may be a small compositional transition in the deposition process. For example, FIG. 3 shows the beam 128 reoriented and directed to the second ingot 124. Initially, the vapor cloud/plume will comprise a residual portion 142 from the first ingot and a portion 144 from the second ingot.

FIG. 4 shows the subsequent stage/mode wherein the beam remains directed to the second ingot 124 and the portion 142 has been expended so that the vapor cloud is essentially derived from the second ingot and not the first ingot so as to deposit the phases 42. Material from the first ingot 122 may be physically blocked from reaching the substrate by positioning an optional shutter 148 (actuator not shown) between the crucible and the substrate. The transition in the vapor deposition process depicted in FIG. 3 would be minimized by rapidly moving the shutter 148 into position immediately as the electron beam is moved from first ingot 122 to second ingot 124.

Because, as described above, the phases 42 are very thin, the elapsed time during the stage/condition/mode depicted in FIG. 4 would be much less than that of the stage/condition/mode depicted in FIG. 2. An exemplary elapsed time during the stage/condition/mode depicted in FIG. 4 would be between 1% and 50% of the time period to complete one rotation of the three-dimensional substrate, or, more narrowly, between 5% and 30% of that time period. Typical time periods to complete one rotation of three-dimensional substrates range from 2 to 20 seconds, or more narrowly 3 to 15 seconds. This allows for the formation of the phases 42 as discrete regions rather than full layers around the entirety of the coated portion of the part.

From the stage/condition/mode depicted in FIG. 4, the system may redirect the beam back to the first ingot (FIG. 5). In the FIG. 5 condition/mode, initially the vapor cloud will comprise residual material 144 from the second ingot and newly-vaporized portion 142 from the first ingot. As the portion 144 is eliminated by blockage by the shutter 146, the condition will revert back to the FIG. 2 stage/condition/mode.

The cycle between depositions from the respective ingots (along with the optional transition stages) may continue until the desired thickness of coating is deposited on the substrate.

An additional coating layer 50 (topcoat, e.g., with a homogeneous chemistry throughout it) may be deposited on top of the matrix 40 with embedded phases 42. The primary role of this topcoat would be to provide resistance to attack by molten silicate deposits that form on the coatings during engine use due to ingestion of dirt. These deposits are commonly referred to as CMAS (for calcium magnesium aluminosilicate). The additional coating layer broadly comprises a layer of oxyapatite and/or garnet.

Herein, garnet refers broadly to an oxide with the ideal formula of $A_3B_2X_3O_{12}$, where A comprises at least one of the metals selected from the group consisting of Ca, Gd, In, Mg, Na, K, Fe, La, Ce, Pr, Nd, Pm, Sm, Eu, Gd, Tb, Dy, Ho, Er, Tm, Yb, Lu, Sc, Y, Ti, Zr, Hf, V, Ta, Cr, W, Mn, Tc, Re, Fe, Os, Co, Ir, Ni, Zn, and Cd; where B comprises at least one of the metals selected from the group consisting of Zr, Hf, Gd, Al, Fe, La, Ce, Pr, Nd, Pm, Sm, Eu, Gd, Tb, Dy, Ho, Er, Tm, Yb, Lu, In, Sc, Y, Cr, Sc, V, Nb, Cr, Mo, W, Mn, Fe, Ru, Co, Rh, Ir, Ni, and Au; where X comprises at least one of the metals selected from the group consisting of Si, Ti, Al, Fe, Cr, Sc, Y, V, Nb, Cr, Mo, W, Mn, Fe, Ru, Co, Rh, Ir, Ni, and Au; and where O is oxygen. Furthermore, limited substitution of S, F, Cl, and OH for oxygen in the above formula is possible in this compound as well, with a concomitant change in the numbers of A, B, and X type elements in the ideal formula, to maintain charge neutrality.

Herein, oxyapatite refers broadly to $A_4B_6X_6O_{26}$ (II) where A comprises at least one of the metals selected from the group consisting of Ca, Mg, Fe, Na, K, Gd, Zr, Hf, Y, Sc, In, La, Ce, Pr, Nd, Pm, Sm, Eu, Gd, Tb, Dy, Ho, Er, Tm, Yb, Lu, Sc, Y, Ti, Zr, Hf, V, Ta, Cr, W, Mn, Tc, Re, Fe, Os, Co, Ir, Ni, Zn, and Cd; where B comprises at least one of the metals selected from the group consisting of Gd, Y, Sc, In, Zr, Hf, Cr, Sc, Y, V, Nb, Cr, Mo, W, Mn, Fe, Ru, Co, Rh, Ir, Ni, and Au; where X comprises at least one of the metals selected from the group consisting of Si, Ti, Al, Cr, Sc, Y, V, Nb, Cr, Mo, W, Mn, Fe, Ru, C, Rh, Ir, Ni, and Au; and where O is oxygen. Furthermore, limited substitution of S, F, Cl, and OH for oxygen in the above formula is possible in this compound as well, with a concomitant change in the numbers of A, B, and X type elements in the ideal formula, to maintain charge neutrality.

As noted above, the coating system and deposition apparatus may be implemented as a modification of an existing coating system and apparatus. The modification may be as simple as merely reprogramming the existing controller of an existing apparatus already used to deposit a two-component TBC (e.g., such as that of the '722 patent). The reprogramming may merely alter the timing of the transitions between deposition stages. Other modifications may involve adding the second source to an existing single-source apparatus.

One or more embodiments have been described. Nevertheless, it will be understood that various modifications may be made. For example, when applied in the reengineering of an existing component and its coating system, details of the existing component and coating system may influence details of any particular implementation. Accordingly, other embodiments are within the scope of the following claims.

The invention claimed is:

1. A process for coating a substrate with a ceramic thermal barrier coating, the substrate comprising an airfoil, the process comprising:
generating a plume of ceramic deposition material from a first source and a second source;
alternating the composition of the plume by generating vapor from the first and second sources in an alternating manner; and
moving the substrate relative, to the first and second sources, wherein:
the moving of the substrate moves a given region of the substrate through the plume with a period greater than a duration of generation of the vapor plume from the second source; and the relative speed of the moving and the frequency of alternation of the composition of the vapor plume are effective to deposit a matrix with embedded second phase patches of the coating from the first source and second source, respectively.

2. The process of claim 1 wherein:
the moving consists of a single rotation.

3. The process of claim 1 wherein:
a duration of generation of the vapor plume from the first source is 400-5000% of said period; and
a duration of generation of the vapor plume from the second source is 30-99% of said period.

4. The process of claim 1 wherein:
the first source comprises a yttria stabilized zirconia; and
the second source comprises at least 40 mole percent of oxides having the formula $Ln_2O_3$, where Ln is selected from the lanthanide La through Lu, Y, Sc, In, Ca, and Mg.

5. The process of claim 1 wherein:
the first source comprises a yttria stabilized zirconia; and
the second source comprises at least 40 mole percent of oxides having the formula $Ln_2O_3$, where Ln is selected from the lanthanide La through Lu, Y, Sc, In, Ca, and Mg with the balance zirconia ($ZrO_2$), hafnia ($HfO_2$), titania ($TiO_2$), or mixtures thereof.

6. The process of claim 1 wherein:
the generating the plume of ceramic deposition material from the first source and the second source comprises electron beam vaporization of the first source and the second source.

7. The process of claim 1 wherein:
each of the second phase patches represents less than 85% of the surface area of the substrate.

8. The process of claim 1 wherein:
deposition material from the first source forms a matrix;

deposition material from the second source forms second phases embedded within the matrix.

9. The process of claim 8 wherein:
the second phases have a characteristic thickness ($T_6$) of less than 2.0 micrometers (μm); and
the spacing between second phases has a characteristic thickness ($T_5$) of less than 8.0 micrometers (μm).

10. The process of claim 8 wherein:
the matrix comprises a yttria stabilized zirconia; and
the second phases comprise at least 40 mole percent of oxides having the formula $Ln_2O_3$, where Ln is selected from the lanthanides La through Lu, Y, Sc, In, Ca, and Mg with the balance zirconia ($ZrO_2$), hafnia ($HfO_2$), titania ($TiO_2$), or mixtures thereof.

11. The process of claim 8 wherein:
the second phases have characteristic thickness ($T_6$) of 0.15-1.0 μm; and
a ratio of the second phases characteristic thickness ($T_6$) to the spacing ($T_5$) between second phases, thickness-wise, is between 1:3 and 1:4.

12. The process of claim 8 wherein:
the matrix with embedded second phases form a layer having a thickness ($T_4$) of at least 76 micrometers.

13. The process of claim 8 wherein:
the matrix with embedded second phases form a layer having a thickness ($T_4$) of 76-350 micrometers.

14. The process of claim 8, further comprising:
applying a bondcoat; and
applying a first TBC layer between the bondcoat and the matrix.

15. The process of claim 14, wherein:
the first TBC layer has a nominal composition differing from a composition of the matrix by the presence of one or more additives in a total amount of up to 1.0 weight percent.

16. The process of claim 8 wherein:
the characteristic thickness ($T_6$) of the second phases is 0.15-1.0 micrometers (μm), and
the characteristic thickness ($T_5$) of the spacing between second phases is 0.5-3.0 micrometers (μm).

17. The process of claim 8, further comprising:
applying an additional coating layer with a homogeneous chemistry atop the matrix with embedded second phases.

18. The process of claim 17 wherein:
the additional coating layer is more resistant to attack by molten silicate deposits than is the matrix.

19. The process of claim 8, further comprising:
applying an additional coating layer atop the matrix and comprising oxyapatite and/or garnet.

20. The process of claim 8, wherein:
the matrix and second phases are in a layer of the thermal barrier coating system with thickness ($T_4$) wherein the second phases account for 5-20% of said layer by volume.

21. The process of claim 1 wherein:
the generating a plume of ceramic deposition material from the first source and the second source is via electron beam physical vapor deposition; and
the alternating of the composition comprises applying the electron beam to the first and second sources in an alternating manner comprising:
a duration of applying the electron beam to the first source of 400-5000% of said period alternating with a duration of applying the electron beam to the second source of 30-99% of said period greater than a duration of generation of the vapor plume from the second source.

22. The process of claim 1 wherein:
the first source comprises a yttria stabilized zirconia.

23. A process for coating a substrate with a ceramic thermal barrier coating, the process comprising:
generating a plume of ceramic deposition material from a first source and a second source;
alternating the composition of the plume by generating vapor from the first and second sources in an alternating manner; and
moving the substrate relative to the first and second sources,
wherein:
the first source comprises a yttria stabilized zirconia;
the second source comprises at least 40 mole percent of oxides having the formula $Ln_2O_3$, where Ln is selected from the lanthanide La through Lu, Y, Sc, In, Ca, and Mg;
the moving of the substrate moves a given region of the substrate through the plume with a period greater than a duration of generation of the vapor plume from the second source;
deposition material from the first source forms a matrix; and
deposition material from the second source forms second phases embeded within the matrix.

24. A process for coating a substrate with a ceramic thermal barrier coating, the process comprising:
generating a plume of ceramic deposition material from a first source and a second source;
alternating the composition of the plume by generating vapor from the first and second sources in an alternating manner; and
moving the substrate relative to the first and second sources,
wherein:
deposition material from the first source forms a matrix;
deposition material from the second source forms second phases embeded within the matrix;
the moving of the substrate moves a given region of the substrate through the plume with a period greater than a duration of generation of the vapor plume from the second source;
the matrix comprises a yttria stabilized zirconia; and
the second phases comprise at least 40 mole percent of oxides having the formula $Ln_2O_3$, where Ln is selected from the lanthanides La through Lu, Y, Sc, In, Ca, and Mg with the balance zirconia ($ZrO_2$), hafnia ($HfO_2$), titania ($TiO_2$), or mixtures thereof.

25. A process for coating a substrate with a ceramic thermal barrier coating, the process comprising:
generating a plume of ceramic deposition material from a first source and a second source;
alternating the composition of the plume by generating vapor from the first and second sources in an alternating manner; and
moving the substrate relative to the first and second sources,
wherein:
deposition material from the first source forms a matrix;
deposition material from the second source forms second phases embedded within the matrix;

the moving of the substrate moves a given region of the substrate through the plume with a period greater than a duration of generation of the vapor plume from the second source; and the method further comprises applying an additional coating layer atop the matrix and comprising oxyapatite and/or garnet.

26. A process for coating a substrate with a ceramic thermal barrier coating, the process comprising:

generating a plume of ceramic deposition material from a first source and a second source;

alternating the composition of the plume by generating vapor from the first and second sources in an alternating manner; and moving the substrate relative to the first and second sources, wherein:

a duration of generation of the vapor plume from the first source is 400-5000% of said period; and a duration of generation of the vapor plume from the second source is 30-99% of said period.

* * * * *